United States Patent
Meehan et al.

(10) Patent No.: US 8,975,953 B2
(45) Date of Patent: Mar. 10, 2015

(54) METHOD OF IMPROVING NOISE IMMUNITY IN A SIGNAL PROCESSING APPARATUS, AND A SIGNAL PROCESSING APPARATUS HAVING IMPROVED NOISE IMMUNITY

(71) Applicant: Analog Devices Technology, Hamilton (BM)

(72) Inventors: Patrick J. Meehan, Limerick (IE); Mark T. Kelly, Limerick (IE); Christopher Peter Hurrell, Berkshire (GB); Thomas Anthony Conway, Limerick (IE); Donal O'Sullivan, Co. Clare (IE); Michael Hennessy, Limerick (IE); William Hunt, Limerick (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 13/793,543

(22) Filed: Mar. 11, 2013

(65) Prior Publication Data

US 2014/0253223 A1    Sep. 11, 2014

(51) Int. Cl.
*H03K 3/01*    (2006.01)
*H03K 17/00*    (2006.01)

(52) U.S. Cl.
CPC ..................................... *H03K 17/00* (2013.01)
USPC .......................................... 327/534; 327/545

(58) Field of Classification Search
CPC ....................................................... G05F 1/467
USPC ........................... 327/530, 534, 538, 543, 545
See application file for complete search history.

(56) References Cited

U.S. PATENT DOCUMENTS

| | | | |
|---|---|---|---|
| 7,020,786 | B2 | 3/2006 | Vyssotski et al. |
| 7,786,916 | B2 | 8/2010 | Quinn et al. |
| 7,791,520 | B2 | 9/2010 | Mathe et al. |
| 8,094,135 | B2 * | 1/2012 | Chen .............................. 345/174 |
| 8,120,410 | B2 * | 2/2012 | Meijer et al. ................... 327/534 |
| 8,692,611 | B2 * | 4/2014 | Crisp et al. ..................... 327/543 |
| 2012/0242523 | A1 | 9/2012 | Kapusta | |

* cited by examiner

*Primary Examiner* — Jeffrey Zweizig
(74) *Attorney, Agent, or Firm* — Patent Capital Group

(57) ABSTRACT

A signal processing apparatus that includes a circuit in which a signal processing function is performed during a first time period, the signal processing apparatus including or being associated with a switch or a filter in a power supply to the signal processing apparatus so as to disconnect the signal processing apparatus from the power supply or to filter the power supply during a second time period that is coincident with at least part of the first time period.

17 Claims, 5 Drawing Sheets

FIG. 10

METHOD OF IMPROVING NOISE IMMUNITY IN A SIGNAL PROCESSING APPARATUS, AND A SIGNAL PROCESSING APPARATUS HAVING IMPROVED NOISE IMMUNITY

TECHNICAL FIELD OF THE DISCLOSURE

The present disclosure relates generally to computer circuitry and, more particularly, to an apparatus, a system, circuitry, and an associated method of providing enhanced immunity from supply rail propagated noise, and to a signal processing apparatus having such enhanced immunity.

BACKGROUND

It is known that noise can affect the outcome of signal processing circuits, especially those that act on analog signals, either throughout the entire operation of the processing circuit or as input variables thereto. A prevalent and important example of a signal processing circuit is an analog to digital converter. Such devices form the interface between the analog domain of the real world and the digital domain, which is generally more convenient for signal processing, and signal storage operations.

BRIEF DESCRIPTION OF THE DRAWINGS

Embodiments will now be described, by way of non-limiting example, in which.

OVERVIEW

According to a first aspect of the present disclosure there is provided a signal processing apparatus includes a circuit (which can include any number of electronic components, as detailed below) in which a signal processing function is performed during a first time period, and where the signal processing apparatus includes or is associated with a switch or a filter in a power supply to the signal processing apparatus so as to disconnect the signal processing apparatus, or a part thereof, from the power supply or to filter the power supply during a second time period that is coincident with at least part of the first time period.

It is thus possible to provide an apparatus in which the propagation of noise via the power supply rail is attenuated or inhibited during a second time period, where the second time period is arranged to overlap with an operation which occurs in the first time period and whose outcome may be perturbed by the presence of noise on the power rail. The first time period may be shorter than and wholly contained within the second time period.

In an embodiment, the signal processing apparatus is an analog to digital converter. During, for example, a successive approximation analog to digital conversion process a digital version of an output value is compared with an analog input value, and the result of that comparison affects the digital output of the analog to digital converter. Noise on the power supply may affect the output of the comparison, giving rise to an incorrect output. The embodiments described herein reduce the risk of noise being propagated by the power rails and perturbing the decision of the comparator, and therefore the accuracy of the conversion result can be improved by reducing randomness or perturbations in the result resulting from noise on the power rail.

The present disclosure is not restricted to use with successive approximation analog to digital converters and may be used with other converter technologies, or indeed any circuit where a comparison operation need to be made, or gain or other signal processing actions need to be performed in a reduced electrical noise environment.

The signal processing apparatus, such as an analog to digital converter may be associated with a local energy storage device, for example in the form of a reservoir capacitor. The reservoir capacitor may be provided as part of the signal processing apparatus, or be provided in association with it. Thus, when for example a switch providing power to the signal processing apparatus is placed in a high impedance state, then power for the signal processing apparatus is temporarily provided by the reservoir capacitor. The switch may be placed in a high impedance state during some, or all of the decisions made by each comparator within the analog to digital converter. The analog to digital converter may be a successive approximation converter, a delta sigma converter (also known as a sigma delta converter), a flash converter, or combinations thereof. Furthermore, the analog to digital converter may comprise a single stage or several pipelined stages.

According to a second aspect there is provided a method of improving noise immunity in a signal processing circuit, the method comprising controlling (e.g., managing, monitoring, etc.) an operation of the signal processing circuit so as to estimate or know when it may be undertaking a process. The result of the process may be susceptible to noise introduced into the circuit by way of a power supply to the signal processing circuit. The method may also include operating a switch to disconnect the circuit from the power supply for at least part of the process, or inserting a noise-reducing filter into the power supply path for at least part of the process.

According to a third aspect of the present disclosure, there is provided a signal processing circuit in association with a power supply, where the signal processing circuit has a first output that can be used to modify the operation of the power supply to reduce noise on a supply rail to the signal processing circuit.

According to a further aspect there is provided an electronic apparatus in combination with a charge transfer circuit adapted to convey charge from a power supply to the electronic apparatus, the charge transfer apparatus comprising a plurality of capacitors associated with respective switches such that while one or more capacitors are connected to the electronic apparatus to provide charge to it, one or more capacitors are connected to the power supply so as to be recharged. In certain example implementation, the electronic apparatus may be a signal processing circuit, a frequency synthesizer, a voltage controlled oscillator, or any other appropriate circuit that would benefit from reduced noise on its power supply.

DETAILED DESCRIPTION OF EXAMPLE EMBODIMENTS

Figure 1:
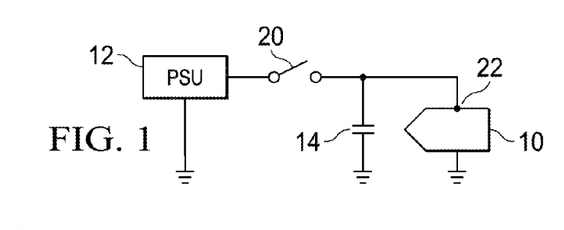
FIG. 1 is a diagram schematically representing a signal processing apparatus, in this example an analog to digital converter, in combination with an electrically controlled switch for temporarily disconnecting it from a power supply.

FIG. 1 schematically shows an embodiment in which a signal processing circuit, in this example an analog to digital converter 10 is provided with power from a power supply 12. The power supply 12 may also supply power to other components, not shown for diagrammatic simplicity. It is therefore possible that noise originating from the power supply 12, or as a result of the operation of the other components, may be propagated towards the analog to digital converter 10. It is also known that circuits may be provided in close association with a reservoir capacitor 14 (also known as a decoupling capacitor as it provides a low impedance path to ground for high frequency signals) which acts to provide some stability to the power supply provided to, for example, a digital circuit, because for example the inductance of tracks on a circuit board between the power supply 12 and the component 10 may be non-negligible.

In the arrangement shown in FIG. 1 an electronically controlled switch 20 is inserted in the power supply path to the analog to digital converter 10 such that the switch may be deliberately placed in a high impedance state so as to isolate the analog to digital converter (ADC) 10 from the power supply 12 during part or all of the analog to digital conversion process.

Figure 2A:
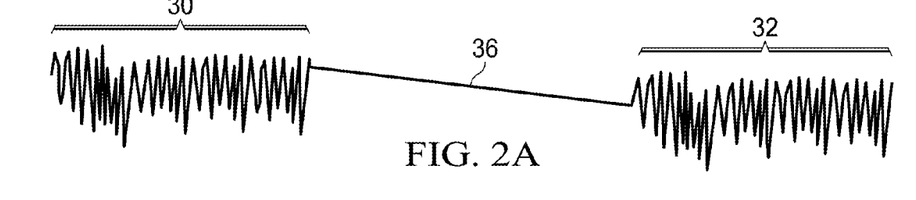
FIGS. 2A, 2B, and 2C are example timing diagrams representing the voltage supply to the analog to digital converter, a control signal for the switch shown in FIG. 1, and the performance of an analog to digital conversion, respectively.
Figure 2B:
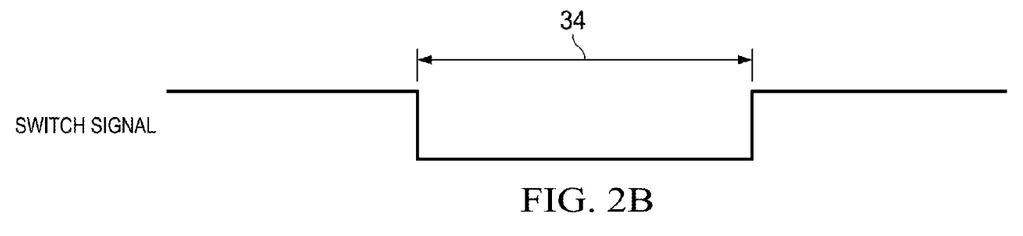
Figure 2C:
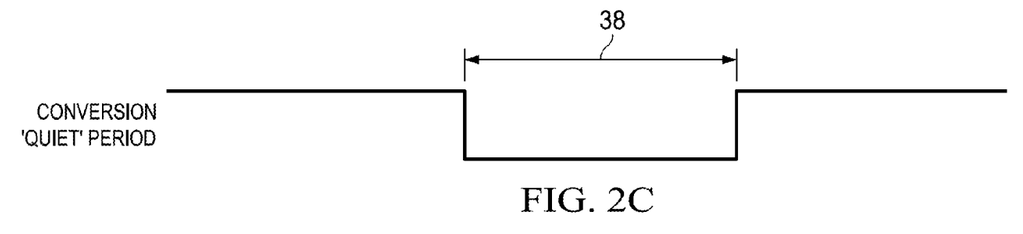

For diagrammatic simplicity, the switch 20 has been shown as being external to the analog to digital converter, and in such an arrangement, the switch may be high impedance for all of the bit trials of the ADC when the ADC is a successive approximation converter. However, as will be described later, the switch 20 may be internal to the ADC, and it may be responsive to a controller within the ADC such that it only depowers part of the ADC, such as a comparator, around moments where the comparator has to make a decision FIGS. 2A to 2C are timing diagrams showing the operation of the circuit of FIG. 1 in detail. FIG. 2A schematically represents the power supply to the analog to digital converter 10 as seen at a power supply node 22 thereof. For diagrammatic convenience, the DC component of the power supply has been suppressed such that the alternating current (AC) noise component can be shown. The AC noise, resulting either from operation of the power supply itself or from noise introduced into the power rail by virtue of the switching action of other circuits fed from the same power supply, is represented during time periods 30 and 32.

In use, and as known to the person skilled in the art, an analog to digital converter may sit in a standby state waiting for receipt of a signal to indicate to it that it is to perform an analog to digital conversion. Such a signal can be regarded as a "start of conversion" signal. Depending on the analog to digital converter topology, or other circuits around it, the start of conversion may also instruct it to acquire an input signal to be converted. This may be as a result of operating an internal sample and hold or track and hold circuit. Thus, in response to the start of conversion signal the switch 20 may be instructed to switch from a low impedance state, as shown during the periods 30 and 32, to a high impedance state as represented by time period 34. During this period, the power required by the analog to digital converter is provided by the associated reservoir capacitor 14. Thus, the voltage at the node 22 becomes significantly quieter, but it may be expected to drop slowly, as the reservoir capacitor starts to discharge (as illustrated by line 36 in FIG. 2A).

Once the signal to be converted is acquired, the analog to digital converter 10 may then perform a conversion during a conversion period 38. It should be noted that some converter technologies are resilient to the effects of power rail noise during the track/sample and hold process. For these converters the switch 20 may remain conducting during this acquisition period.

It can be seen that the conversion period 38, which may be regarded as a first period in which the analog to digital converter may be affected by power supply noise temporally overlaps with a second time period during which the analog to digital converter is disconnected from the power supply 12.

It is convenient if the second time period 34 completely overlaps the first time period 38, although this need not necessarily always be the case. In order to address this further, it is desirable to consider the operation of an analog to digital converter, such as a SAR converter, in greater detail.

Figure 3:
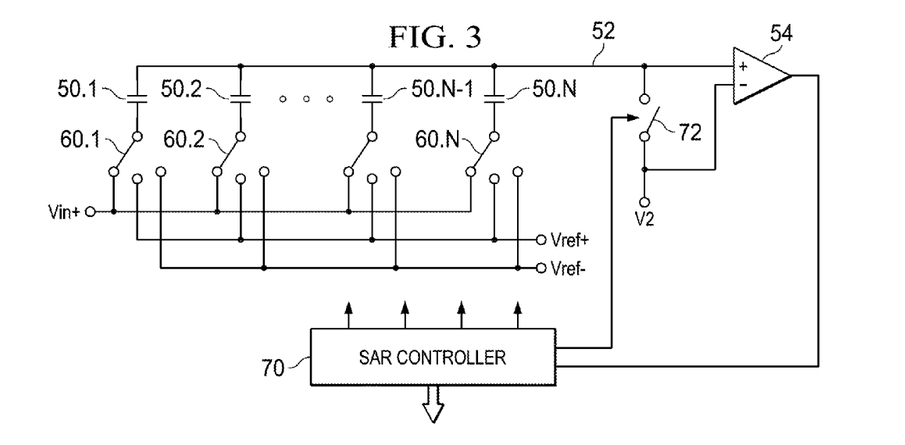
FIG. 3 is a simplified circuit diagram of a successive approximation analog to digital converter according to one embodiment of the present disclosure.

FIG. 3 is a simplified diagram of a switched capacitor successive approximation routine analog to digital converter. The successive approximation converter comprises the capacitor array, formed of capacitors 50.1 to 50.N. In a relatively simplified embodiment, N represents the number of bits of resolution of the array. Thus, for an analog to digital converter exhibiting 16 bit resolution then N is 16, or as will be discussed later, potentially greater than 16. The capacitors 50.1 to 50.N are arranged to provide a binary weighting from one capacitor to the next. Thus, the first capacitor 50.1 is twice the size of, i.e. has twice the capacitance of, the second capacitor 50.2, and so on. This would lead to a large size difference between the first capacitor and the Nth capacitor, and therefore it is known to the person skilled in the art to segment the array into two or more segments. This allows the scaling factors to be reset from one segment to the next thereby avoiding excessive discrepancies between the sizes of the largest and smallest capacitors. These techniques are well known and need not be described here, but are mentioned merely for the sake of completeness. It should also be mentioned that whilst for convenience the capacitors are scaled in a binary nature, radix=2, other scalings are possible such as radix 1.8 in order to provide redundancy within the converter. It is also possible to add further capacitors within the array, which can be regarded as corresponding to redundant bits within the conversion process, in order to provide the opportunity to reassess the conversion result at various stages within the successive approximation conversion and to undo any previous incorrect bit selection decisions.

Returning to the simplified arrangement shown in FIG. 3, each of the capacitors 50.1 to 50.N has an uppermost plate, often referred to as a top plate, connected to a common conductor 52. The common conductor 52 is connected to a first input, here the non-inverting input, of a comparator 54. The second plates of the capacitors 50.1 to 50.N, which may be referred to as bottom plates, are connected to respective switches 60.1 to 60.N which are responsive to a successive approximation routine (SAR) controller 70 such that the switches 60.1 to 60.N are individually controllable to connect the bottom plate of their respective capacitor to either an input signal Vin+, a first voltage reference Vref+, or a second voltage reference Vref−. The analog to digital converter also includes a sample switch 72 responsive to the SAR controller 70 to connect the common conductor 52 to a reference voltage, designated V2, during a sampling operation. Typically, V2 might equate to Vref− or might equate to the nominal midpoint of the analog to digital converter operating range. This latter option is more preferred, since it ensures that the operating voltages at the transistors of the input stage of the comparator 54 can be conveniently centered with respect to the supply rail voltage.

In operation, for example in response to the start of convert signal or to a sample signal, the switches 60.1 to 60.N are selected so as to connect the bottom plates of the corresponding capacitors 50.1 to 50.N to the input signal Vin+. This SAR controller 70 also causes the sampling switch 72 to close (low impedance). Thus each of the capacitors 50.1 to 50.N becomes charged to a voltage which corresponds to Vin+−V2. Once the sample phase has been completed, for example by allowing a sufficient time for the sampling to be performed the controller 70 instructs the switch 72 to open. This causes the voltages on the capacitors 50.1 to 50.N to be held. It should be noted that the circuit of FIG. 3 can be operated in a track and hold state by leaving switches 60.1 to 60.N in the configuration whereby they connect to the bottom plates of the capacitors to Vin+ and leaving switch 72 closed at those times when the converter is not actually performing the analog to digital conversion.

Having acquired the analog signal, the analog to digital converter now moves in to a successive approximation routine in which the bits of the conversion result are successively trialed as known to the person skilled in the art to arrive at a digital output word. Thus, for the first bit trial which corresponds to the most significant bit of the conversion result the capacitors 50.2 to 50.N are connected to Vref− by their respective switches 60.2 to 60.N. The first capacitor 50.1 is connected to Vref+. This causes charge redistribution to occur within the capacitor array such that the array compares the sampled signal with the digital value for the most significant bit as represented by the first capacitor 50.1 (i.e. output word 1000 . . . ) and the output of the comparator 54 shows whether the input signal Vin+ is larger than the first bit trial voltage (i.e. the midway point of the analog to digital converter conversion range) or less than it. If Vin+ is greater than this value then the SAR controller 70 acts to keep the first capacitor 50.1 connected to Vref+, and the most significant bit is set as 1 otherwise it discards the bit trial result by reconnecting the capacitor 50.1 back to Vref−. Thus, the first bit trial result is now kept, whether its value is a 1 or a zero and the SAR converter moves on to testing the second bit in which switch 60.2 is operated to connect the capacitor 50.2 to Vref+. Once this has been done and the circuit has had time to stabilize, the output of the comparator is checked, and as a result the second bit trial either results in the second bit being set to a "1" and the second capacitor remaining connected to Vref+ or the second bit is set to a "0" and the second capacitor is connected to Vref−. This process is repeated for the other switches until the switch positions of each of the capacitors have been determined corresponding to obtaining values for the first to Nth bits.

At some point in the process described with respect to FIG. 3, a critical decision will occur. A problem with a critical decision is that one does not know in advance at which bit trial the critical decision happens. This will be explained in greater detail with respect to FIG. 4.

Figure 4:
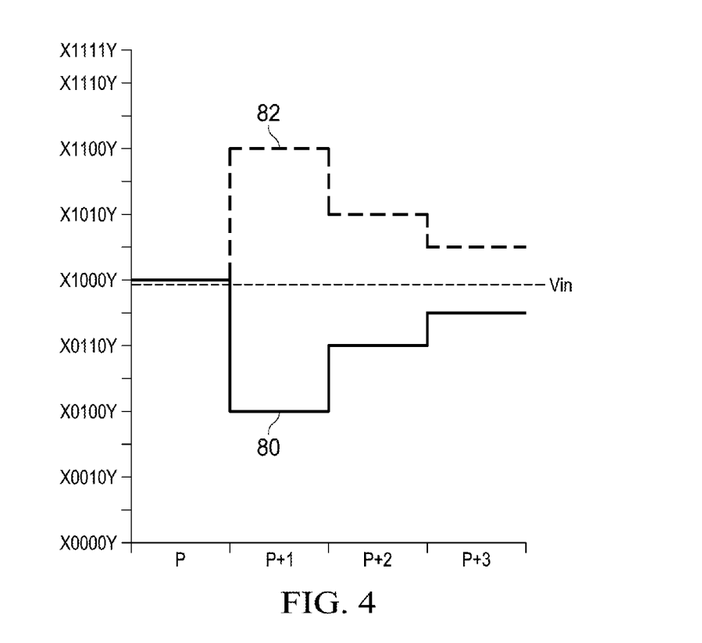
FIG. 4 is a diagram representing part of a successive approximation conversion routine so as to demonstrate the effect of noise on a "critical decision" within the conversion routine according to one embodiment of the present disclosure.

FIG. 4 diagrammatically represents the digital values being formed by switching of the capacitors within the capacitor array of FIG. 3 during four-bit trials, designated P to P+3. The sequence of four-bit trials might occur anywhere within the N bit trials performed in the converter of FIG. 3 and this is schematically represented by the X, which precedes the binary values shown in the ordinate of FIG. 4, and the "Y" which succeeds them. For simplicity, it is easier to consider these four trials as representing the first four trials of the bit sequence. FIG. 4 also schematically illustrates the analog input signal Vin that has been acquired. It can be seen that Vin has, in this example, a value that is just slightly less than the value of "1000Y," which corresponds to just slightly less than the value by selecting the first capacitor 50.1 for connection to Vref whilst leaving all of the other capacitors corrected to Vref−. The purposes of this discussion is also to be assumed that the critical decision occurs at the first bit trial, this is because the digital value being trialed and the analog value that was sampled are close to one another. As noted before this critical decision can occur an any point during the bit trial sequence where the digital value being tested against the analog input sample is close to the analog input sample, and in this context close generally equates to 1 or 2, LSB least significant bit sizes.

If the analog to digital converter is operating correctly, then the comparator 54 would note that the digital value represented by "1000 . . . " is slightly greater than Vin, and consequently the first bit trial should be discarded and bit 1 (the MSB) set to zero, the second bit would then be trialed which would be kept, as would the third bit and the fourth bits. Thus after the four bit trials shown in FIG. 4 the result "X0111Y" would represent the correct decision sequence for the analog to digital converter so far, as represented by line 80.

However, if as a result of noise such as a power rail induced noise occurring at the comparator 54 the comparator makes an incorrect decision, then the Pth bit would be kept. The next bit trial of the P+1 bit is represented by the chain dot line 82 where, because the result is now clearly much greater than Vin, the P+1th bit is discarded and its bit value is set to zero. The same occurs in the next two bits, so as a result of an error at the critical decision for the Pth bit trial, the converter has arrived at a result "X1000Y."

Thus, power supply induced noise has caused the output result from the analog to digital conversion to become corrupted. As the conversion progresses, and as shown in FIG. 4, the results should start to converge, although it remains possible that if the power supply rail induced noise is sufficiently large, then further bit trials may also become corrupted as the results converge. For this reason, it is advantageous for the switch 20 to be in a high impedance state during the entirety of the conversion process, or during those moments where the comparator 54 makes a decision.

However, as mentioned hereinbefore, some more advanced converter topologies include redundant bits, or may allow for the last few bits of any bit trial to be repeated for averaging purposes. Thus for these converter topologies it is permissible to only place the switch 20 in a high impedance state for the last M bits of the conversion, for example M may equal 4 or 5.

Figure 5:
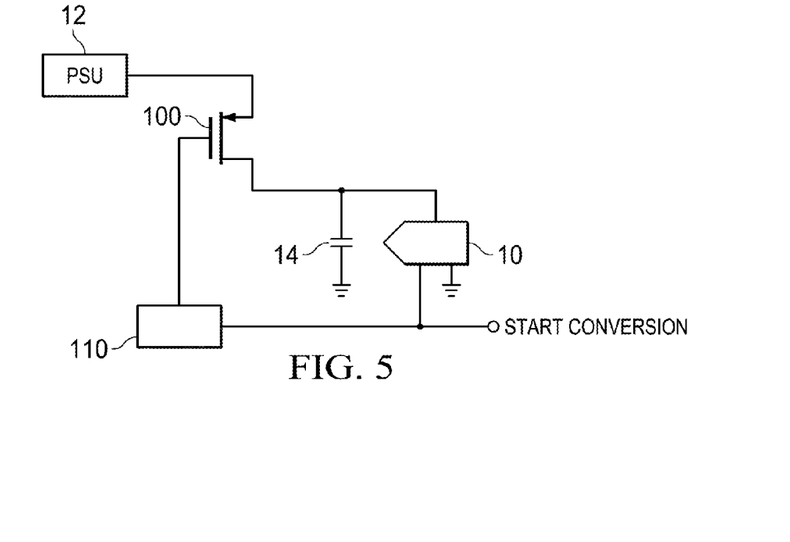
FIG. 5 is a circuit diagram of an implementation of the arrangement schematically shown in FIG. 1 according to one embodiment of the present disclosure.

FIG. 5 shows a circuit arrangement of that shown in FIG. 1 in greater detail. Here the analog to digital converter 10 is connected to the power supply 12 by way of a switch, which in this example is a PMOS field effect transistor switch 100. The PMOS switch 100 is made conducting by pulling its gate down to the local ground level and is made non-conducting by allowing its gate to tend towards the supply rail voltage provided by the supply unit 12. A switch controller 110 is responsive to a start conversion signal, which is also provided to the analog to digital converter 10. In an alternative arrangement, it would be possible to derive a precursor signal that slightly leads the start of conversion signal provided to the analog to digital converter 10 in order to ensure that the switch 100 has been placed in a high impedance state prior to starting the conversion. If, as would normally be the case, the switch 100 is driven by a digital signal, then when it is switched off it is essentially non-conducting, whereas whilst it is switched on it exhibits an on resistance $R_{dson}$ that may be in the region of 1 ohm or less. The switch is chosen to have a sufficiently rapid switching time.

As noted before the analog to digital converter may be isolated from the supply for the duration of its conversion process. This is appropriate provided that the reservoir capacitor 14 can be sized to be sufficiently large to avoid an unacceptable voltage droop during the conversion process. However, if space constraints are such that an appropriately sized capacitor cannot be provided for example because the circuit board has become densely packed or because the capacitor is being provided on chip, it is possible to operate the switch 100 during only the final few bits of the conversion process especially where redundancy is provided so as to correct the small conversion errors. It may also be desirable to modify the drive signal to the gate of the transistor 100 such that the transistor does not switch off completely but exhibits higher impedance. The higher impedance can be represented by a value R, which then forms a low pass RC filter with the reservoir capacitor 14. Even though the analog to digital converter is not completely isolated from the supply, the noise bandwidth at the supply note 22 becomes much reduced. The transistor 100 may, in all probability, exhibit a parasitic drain source capacitance when it is in the notionally off state. However this capacitance appears in series with that of the reservoir capacitor 14 and hence the capacitive potential divider is formed which still acts to reduce the noise power transmitted to the node 22.

Figure 6:
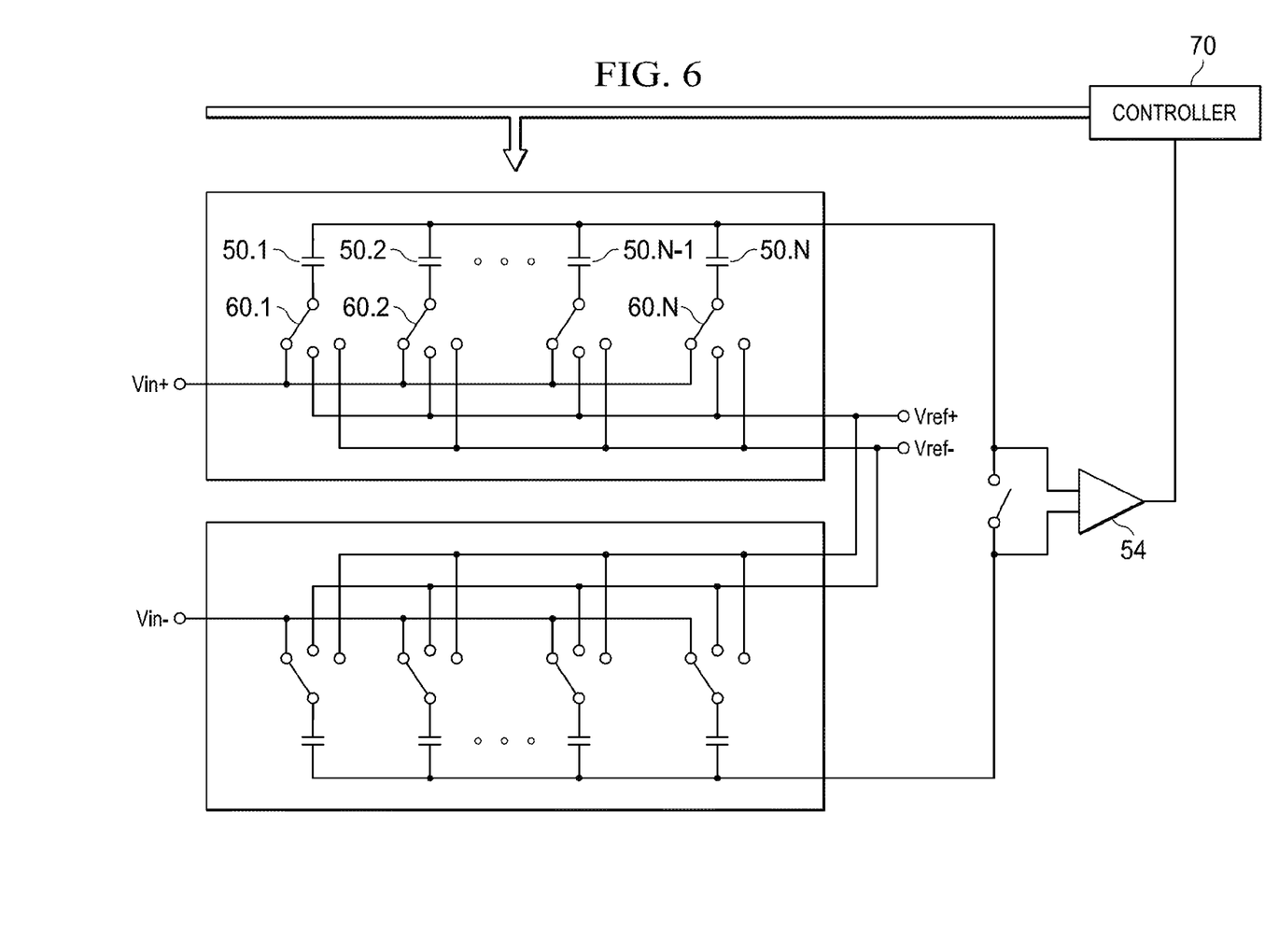
FIG. 6 is a schematic representation of a further SAR converter implementation according to one embodiment of the present disclosure.

Although discussions so far have focused on a single ended analog to digital converter, differential or dual ended devices do exist, an example of one is shown in FIG. 6. It can be seen that the switch capacitor array 50.1 to 50.N and its associated switches 60.1 to 60.N of FIG. 3 are duplicated and connected to the inverting input of the comparator 54. The techniques described herein are equally suited for use with differential analog to digital converters as shown in FIG. 6. Furthermore, since the controller 70 can independently control the switches 60.1 to 60.N in the first capacitor array and the corresponding switches in the array used to sample Vin–, this affords even greater opportunities to recover from an incorrect bit decision relatively early on in the conversion process.

Figure 7:
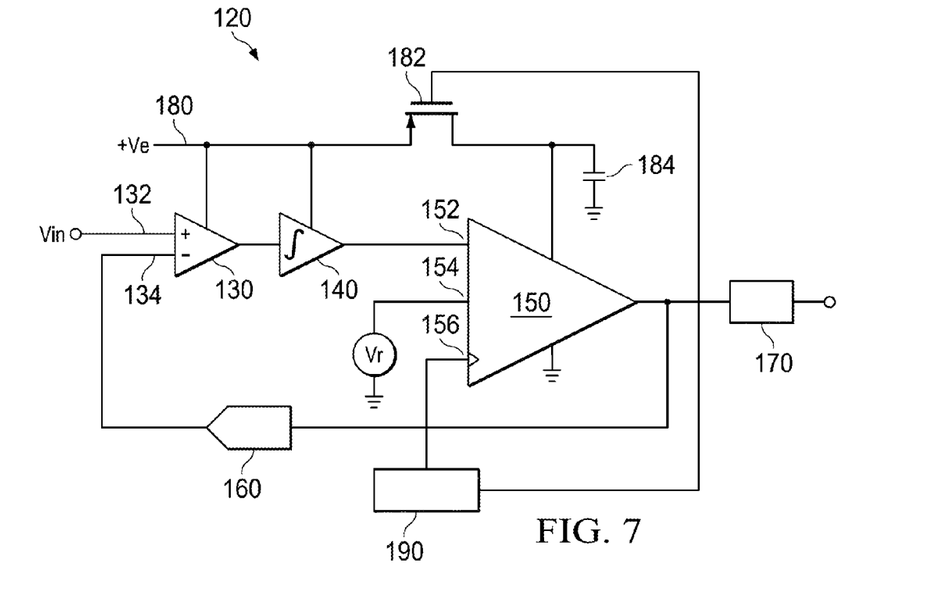
FIG. 7 is a schematic diagram of a sigma-delta ADC where only part of the circuit, specifically the comparator, is selectively disconnectable from the supply rail during a period encompassing a comparator decision period according to one embodiment of the present disclosure.

FIG. 7 is a schematic diagram showing a further embodiment, this time in the context of a sigma-delta converter. The operation of a sigma-delta converter is known to the person skilled in the art. The sigma-delta converter 120 comprises a difference amplifier 130, which receives an analog input signal Vin at a first input, such as a non-inverting input 132, and a further signal at its inverting input 134. As will be discussed later, the signal provided to the inverting input is typically provided by a digital to analog converter, DAC. The DAC may be simple, such as a 1 bit DAC. An output of the difference amplifier 130 is provided to an integrator 140, which integrates the signal and provides it to a first input 152 of a comparator 150. The comparator 150 compares the output of the integrator with a reference voltage Vr supplied to its second input 154. An output from the comparator 150 is used to drive the DAC 160 and is also provided to a decimation filter 170. The configuration described so far is commonplace in sigma-delta converters.

The difference amplifier, integrator, and comparator all receive power via a supply rail 180. The rail 180 may be provided as a metallic track within an integrated circuit where all of the components described herein have been provided within a single integrated circuit package. However, the supply to the comparator 150 is by way of a transistor switch 182. A reservoir capacitor 184 is provided in communication with the power supply to the comparator 150 so as to provide power to it while the switch 182 is in a high impedance state.

The comparator 150 also has a strobe input to cause it to hold/latch the instantaneous result of the comparison when the strobe signal is asserted. The result may be updated on successive transitions of the strobe signal at the strobe input 156. A controller 190 may control the operation of the switch 182 and the strobe signal. The controller 190 may place the switch 182 in a high impedance state to address the supply to the comparator 150 prior to asserting the strobe signal to cause the comparator 150 to make and latch its decision. A guard period may separate the placing of the switch 182 in a high impedance state from the strobing of the comparator. Once the comparator has made its decision, the switch 182 may be returned to a low impedance state so as to supply power to the comparator and recharge the reservoir capacitor 184 in preparation for the next comparison event. Although this has been descried in the context of a sigma delta converter, the same timing may be used in a successive approximation routine converter or indeed any circuit having a comparator.

In FIG. 7, the switch 182 was provided as part of the processing circuit. However if the processing circuit can output a control signal requesting that the supply be "made quiet" then this can be used by a power supply to modify its operation.

Figure 8:
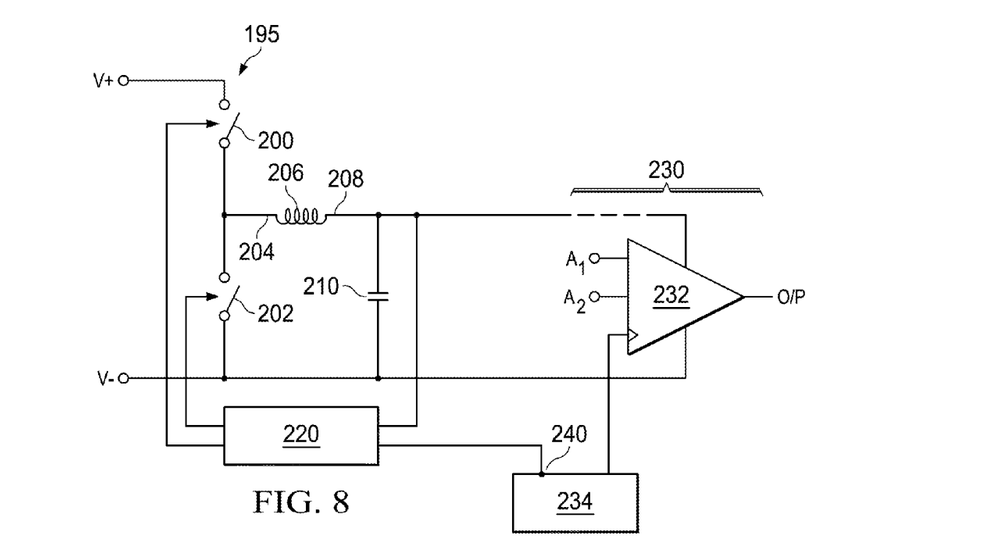
FIG. 8 is a schematic diagram of a power supply having an input such that it can be responsive to a control signal to modify its operation according to one embodiment of the present disclosure.

FIG. 8 schematically shows a switched mode converter 195 where switches 200 and 202 can be controlled to connect a first node 204 of an inductor 206 or either a positive voltage V+ or to the local ground, designated V–. A second node 208 of the inductor is connected to a smoothing or reservoir capacitor 210. The voltage across the capacitor 210 is monitored by a power supply controller 220, which controls the operation of the switches 200 and 202. Control strategies for such switched mode controllers are known to the person skilled in the art and need not be described here. As shown, the converter 195 provides power to a signal processing circuit 230, which includes a component whose decision or output may be perturbed by power rail noise. For simplicity, the processing circuit 230 is shown as including a strobed comparator 232 responsive to a strobe controller 234. The strobe controller 234 has a further output 240 which it can use to request the controller 220 of the voltage converter 195 to modify operation of the converter to reduce the noise generated by the converter 195. Thus asserting the output 240 may cause the controller 195 to cease switching the transistors 200 and 202 for a predetermined time period. Thus reduced voltage regulation may be traded for reduced power supply generated noise during a decision period of the comparator 232.

Figure 9:
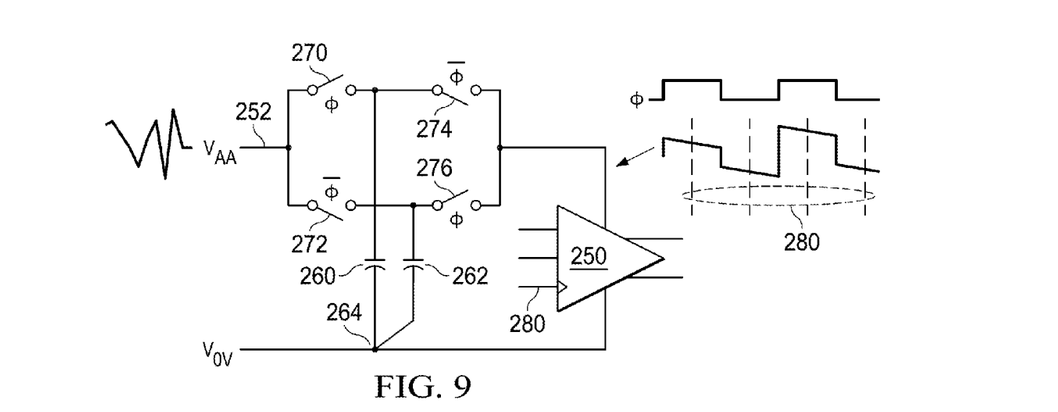
FIG. 9 is a schematic diagram of a signal processing circuit with a capacitor based charge supply arrangement according to one embodiment of the present disclosure.

In a further arrangement, as shown in FIG. 9, a part of an electronic circuit, which may comprise a processing circuit, such as comparator 250, may never be directly connected to the power rail 252, which may inadvertently convey noise as well as power. The comparator 250 of FIG. 9 is associated with two (although it could be more) reservoir capacitors 260 and 262. Bottom plates (as shown in FIG. 9) of the capacitors may be connected to a local 0V node 264.

Each of the top plates of the capacitors 260 and 262 can be independently connected to the supply rail 252 by way of first and second switches 270 and 272, respectively. The top plates of the capacitors can also be independently connected to the comparator 250 by third and fourth switches 274 and 276 respectively. A single drive signal φ may be used to drive each of the switches, with the first and fourth switches 270 and 276 receiving a non-inverted version of the drive signal and the second and third switches 272 and 274 receiving an inverted version of the drive signal. When the drive signal, which may be a square wave as shown is asserted the first capacitor 260 is connected to the supply 252 to charge it, whereas the second capacitor 262 is connected to the comparator 250 so as to power it. When the drive signal is inverted, then the first capacitor 260 is connected to the comparator to power it while the second capacitor 262 is connected to the supply to be recharged.

The capacitors 260 and 262 do not need to be of equal capacitance and the drive signal need not have a 1-1 mark/space ratio, although both of these choices may be adopted for simplicity. A strobe signal 280 to the comparator 250 may be timed to avoid the transitions of the drive signal φ.

Figure 10:
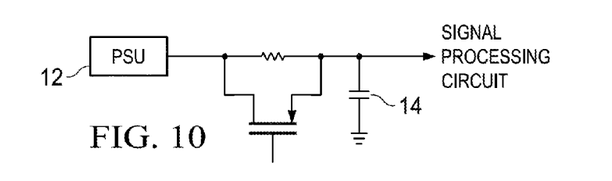
FIG. 10 shows a modification to the switch arrangement used to connect the signal processing circuit to the power supply according to one embodiment of the present disclosure.

Although the switches have been shown as transistor switches generally switchable between conducting and non-conducting states, the transistor switch may be placed in parallel with a component such as a resistor, as shown in FIG. 10 such that the supply to the signal processing component is never completely switched off, but instead the noise bandwidth from the supply to the signal processing component can be reduced when the transistor is non-conducting.

It is thus possible to provide an inexpensive and effective way of reducing the effects of power supply borne noise at a signal processing circuit, such as an analog to digital converter. The Analog to digital converter may be embedded within a more complex circuit, such as a microcontroller.

In one example embodiment, any number of electrical circuits of the FIGURES may be implemented on a motherboard of an associated electronic device. The motherboard can be a general circuit board that can hold various components of the internal electronic system of the electronic device and, further, provide connectors for other peripherals. More specifically, the motherboard can provide the electrical connections by which the other components of the system can communicate electrically. Any suitable processors (inclusive of digital signal processors, microprocessors, supporting chipsets, etc.), memory elements, etc. can be suitably coupled to the motherboard based on particular configuration needs, processing demands, computer designs, etc. Other components such as external storage, additional sensors, controllers for audio/video display, and peripheral devices may be attached to the motherboard as plug-in cards, via cables, or integrated into the motherboard itself.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors and memory elements, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A signal processing apparatus, comprising:
a circuit in which a signal processing function is performed during a first time period, the signal processing apparatus including or being associated with a switch or a filter in a power supply to the signal processing apparatus so as to disconnect the signal processing apparatus from the power supply or to filter the power supply during a second time period that is coincident with at least part of the first time period.

2. A signal processing apparatus as claimed in claim 1, wherein the signal processing apparatus comprises an analog to digital converter.

3. A signal processing apparatus as claimed in claim 2, wherein the analog to digital converter comprises a successive approximation routine (SAR) analog to digital converter, and wherein the successive approximation routine is performed in the first time period, and the second time period overlaps with a final M bit trials of a conversion.

4. A signal processing apparatus as claimed in claim 3, wherein the second period overlaps with an entirety of the first period.

5. A signal processing apparatus as claimed in claim 1 further including a reservoir capacitor connected after the switch or filter.

6. A signal processing apparatus as claimed in claim 5, wherein the switch or filter comprises a transistor in series with the signal processing apparatus.

7. A signal processing apparatus as claimed in claim 6, wherein the transistor is controlled with a substantially digital signal to cause it to act as a switch.

8. A signal processing apparatus as claimed in claim 6, wherein the transistor is controlled with a control signal that increases a resistance of the transistor so as to form a filter.

9. A signal processing apparatus as claimed in claim 1, wherein the signal processing apparatus is connected to the power supply during time period not forming part of the second period so as to re-establish a supply to the circuit.

10. A signal processing apparatus as claimed in claim 3, wherein the switch or filter is controlled in response to a start conversion signal of the analog to digital converter or in response to a precursor at such a signal.

11. A signal processing apparatus as claimed in claim 3, wherein a duration of a conversion associated with the SAR is known, and the switch or filter is maintained in a state so as to disconnect the converter from the power supply or to filter the power supply during the duration of the SAR conversion.

12. A signal processing apparatus as claimed in claim 3, wherein the SAR converter asserts an end of conversion signal once it has completed a conversion, and the switch or filter is placed in a low impedance state in response to the end of conversion signal.

13. A signal processing apparatus as claimed in claim 2, wherein the analog to digital converter is a sigma-delta converter, a pipeline converter, or a hybrid converter.

14. A method of improving noise immunity in a signal processing circuit, the method comprising:
controlling an operation of the signal processing circuit to estimate when it may be undertaking a process where the result of the process is susceptible to noise introduced into the signal processing circuit by way of a power supply for the signal processing circuit; and
operating a switch to disconnect the signal processing circuit from the power supply for at least a first part of the process.

15. A method as claimed in claim 14, wherein the signal processing circuit is in parallel with a reservoir capacitor and the signal processing circuit and the reservoir capacitor are connected to the power supply via an electrical switch, and wherein the process is being performed when the switch is in a high impedance state such that power to the signal processing circuit is being provided by the reservoir capacitor.

16. A method as claimed in claim 14, wherein the signal processing circuit includes a noise reducing filter, and further comprising:
directing power from the power supply to the noise reducing filter for at least a second part of the process.

17. A signal processing circuit, comprising:
a first output that can be used to modify an operation of a power supply to reduce noise on a supply rail to the signal processing circuit,
wherein a signal processing function is performed during a first time period, and the first output is used to modify the operation of the power supply during a second time period that is coincident with at least part of the first time period.

* * * * *